United States Patent
Nelson et al.

(10) Patent No.: US 7,069,095 B2
(45) Date of Patent: Jun. 27, 2006

(54) SYSTEM AND METHOD FOR POPULATING A COMPUTER-AIDED DESIGN PROGRAM'S DATABASE WITH DESIGN PARAMETERS

(75) Inventors: Jerimy Nelson, Fort Collins, CO (US); Mark D. Frank, Longmont, CO (US); Karl Bois, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 286 days.

(21) Appl. No.: 10/727,974

(22) Filed: Dec. 4, 2003

(65) Prior Publication Data

US 2005/0125747 A1    Jun. 9, 2005

(51) Int. Cl.
*G06F 19/00* (2006.01)

(52) U.S. Cl. .................... 700/98; 700/121; 700/97; 716/1

(58) Field of Classification Search .............. 700/98, 700/14, 182, 97; 716/1, 11; 345/420
See application file for complete search history.

(56) References Cited

U.S. PATENT DOCUMENTS

| | | | |
|---|---|---|---|
| 4,870,561 A | 9/1989 | Love et al. | |
| 5,079,731 A | 1/1992 | Miller et al. | |
| 5,517,607 A | 5/1996 | Nishimura et al. | |
| 5,623,417 A | 4/1997 | Iwasaki et al. | |
| 5,623,418 A | 4/1997 | Rostoker et al. | |
| 5,649,165 A | 7/1997 | Jain et al. | |
| 5,655,109 A | 8/1997 | Hamid | |
| 5,689,711 A | 11/1997 | Bardasz et al. | |
| 5,712,794 A | 1/1998 | Hong | |
| 5,721,813 A | 2/1998 | Leinhos | |
| 5,754,738 A | 5/1998 | Saucedo et al. | |
| 5,757,655 A | 5/1998 | Shih et al. | |
| 5,828,580 A | 10/1998 | Ho | |
| 5,838,328 A | 11/1998 | Roller | |
| 5,856,925 A | 1/1999 | Maeda et al. | |
| 5,901,066 A | 5/1999 | Hong | |
| 5,963,727 A | 10/1999 | Shih et al. | |
| 6,226,781 B1 | 5/2001 | Nistler et al. | |
| 6,292,707 B1 | 9/2001 | Hair et al. | |
| 6,304,790 B1 | 10/2001 | Nakamura et al. | |
| 6,499,135 B1 | 12/2002 | Li et al. | |
| 6,686,914 B1 * | 2/2004 | Keener ..................... | 345/420 |
| 2002/0023110 A1 | 2/2002 | Fortin et al. | |
| 2004/0098689 A1 * | 5/2004 | Weed ........................ | 716/11 |

OTHER PUBLICATIONS

"About SPICE", eCircuit Center [online] Retrieved on Nov. 5, 2003 Retrieved from: http://www.ecircuitcenter.com/AboutSPICE.htm 3 pages.

"SPICE Basics", eCircuit Center [online] Retrieved on Nov. 5, 2003 Retrieved from http://www.ecircuitcenter.com/Basics.htm 6 pages.

(Continued)

*Primary Examiner*—Albert W. Paladini
*Assistant Examiner*—Steven R. Garland (57) ABSTRACT

According to at least one embodiment, a method comprises generating a data file having design parameters for an electrical design, and with a computer-executable program, accessing the data file and populating a computer-aided design (CAD) program's database with the design parameters.

28 Claims, 4 Drawing Sheets

OTHER PUBLICATIONS

Cadence PCB, "Allegro Product Family," Internet, http://www.cadencepcb.com/products/allegro/family.asp, Oct. 16, 2003, pp. 1-2.

Cadence PCB, Allegro Product Home Page, "Allegro High-speed PCB layout,routing, and manufacturing output," Internet, http://www.cadencepcb.com/products/allegro, Oct. 16, 2003, p. 1.

PC Engines™, Programmable Keypad for Cadence Allegro™, Internet http://www.pcengines.ch/keypad.htm, Oct. 16, 2003, p. 1.

Cadence PCB, Allegro: Product Integration, Products, "Allegro Integration," Internet http://www.cadencepcb.com/products/allegro/integration.asp, Oct. 16, 2003, pp. 1-2.

Candence PCB, Allegro: Top Benefits, Products, "ALLEGRO Top Benefits," Internet http://www.cadencepcb.com/products/allegro/topbenefits.asp, Oct. 16, 2003, pp. 1-2.

Cadence PCB, APE/APD IC Packaging Home Page, Products, "IC Packaging Advanced environment for design and analysis of high-density IC package," Internet http://www.cadencepcb.com/products/icpackaging/, Oct. 16, 2003, p. 1.

Cadence PCB, IC Packaging: Product Family, Products, "IC PACKAGING Product Family," Internet http://www.cadencepcb.conm/products/icpackaging/family.asp, Oct. 16, 2003, p. 1.

Cadence PCB, IC Packaging: What's New , Products, "IC PACKAGING What's New in Release 15.0," Internet http://www.cadencepcb.com/products/icpackaging/whatsnew.asp, Oct. 16, 2003, pp. 1-6.

Cadence, "Advanced Package Designer QuickStart Service.", 2001.

Cadence PCB, PCB Design Studio: Datasheet, "PCB Design Studio Datasheet," Internet http://www.cadencepcb.com/products/studiosuite/datasheets/default.asp, Oct. 16, 2003, pp. 1-9.

Cadence, datasheet, "Advanced Package Designer," Candence's® Advanced Package Designer System, Industry Overview , Copyright® 1998. Cadence Design Systems, Inc. Marketing Services, pp. 1-2.

* cited by examiner

SYSTEM AND METHOD FOR POPULATING A COMPUTER-AIDED DESIGN PROGRAM'S DATABASE WITH DESIGN PARAMETERS

BACKGROUND

Computer-aided design (CAD) programs are commonly used for designing electronic devices, such as integrated circuits, printed circuit boards, microelectromechanical systems (MEMS), and nanoelectromechanical systems (NEMS). An example of such a CAD program is the Advanced Package Designer (APD) System available from Cadence Design Systems, Inc. The APD system provides an environment for the design and analysis of high-speed, high-density integrated circuit packages, multichip modules, and hybrids. This environment provides a framework for integrated circuit integration, physical layout, package modeling, interconnect routing, and analysis. The ALLEGRO® printed circuit board (PCB) layout system, which is also available from Cadence Design Systems, Inc., provides an interactive environment for designing complex and/or high-speed, multi-layer printed circuit boards CAD programs commonly handle such tasks as circuit synthesis, simulation, layout generation, and layout verification. CAD programs generally include an interface for receiving various parameters for a desired design from a user and for outputting a representation of the resulting design to the user (e.g., as a schematic diagram and/or a netlist). In this manner, CAD programs aid a developer in visualizing an electronic design.

Many electronic designs have a plurality of layers (or a "layer stackup"). Each layer of an electronic design may be of a conducting material (e.g., metal) or a dielectric material, as examples. For instance, conductor layer(s) may be included in a printed circuit board's stackup for forming routing layer(s) in which traces for routing electrical signals (e.g., data) between components of the printed circuit board may be formed. Dielectric layer(s) may be used for electrically isolating different conductor layers from each other.

In defining an electronic design, a user generally interacts with a CAD's interface to specify various parameters of the design. For instance, a user generally specifies the number of layers to be included in the design, as well as various parameters associated with each layer, such as the layer type (e.g., the type of material to be used for the layer), the layer's thickness, etc. The user interface of a CAD, such as the ADP and ALLEGRO® systems mentioned above, generally provides drop-down menus through which a user may progress for selecting various parameters of a design, such as the corresponding type and thickness of a layer. Once a design is created in a CAD, the user may interact with the CAD's interface to change parameters of the design. For instance, suppose that after a design is created in a CAD the user desires to change the thickness and/or material type of various layers of the design. In this case, the user may interact with the CAD's interface to select a layer and proceed through pull-down menus to change the layer's corresponding material type and/or thickness. The user may then repeat this procedure for each layer desired to be modified.

SUMMARY

According to at least one embodiment, a method comprises generating a data file having design parameters for an electrical design, and with a computer-executable program, accessing the data file and populating a computer-aided design (CAD) program's database with the design parameters.

DETAILED DESCRIPTION

Figure 1:
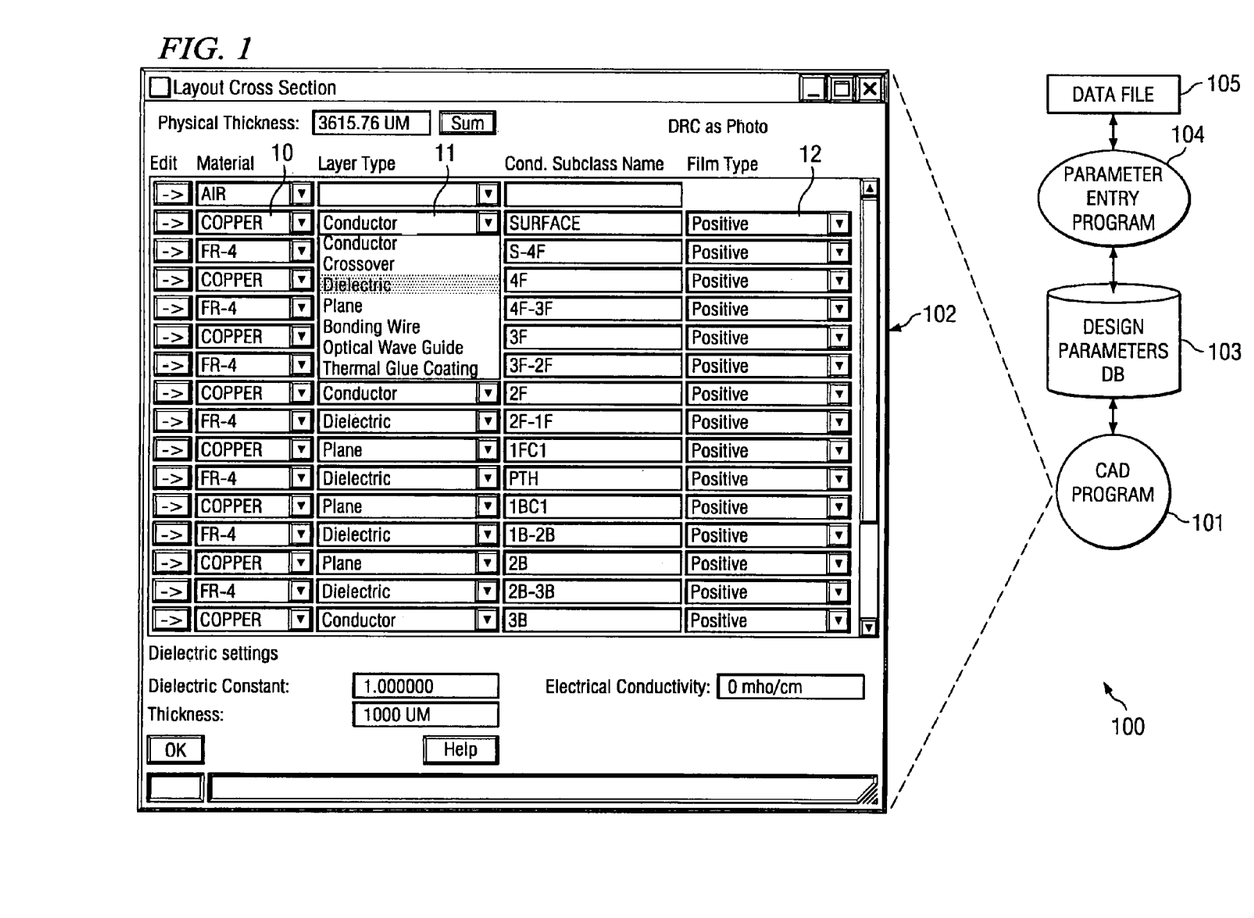
FIG. 1 shows an example system according to an embodiment for populating a CAD's database with design parameters.

Turning to FIG. 1, an example system 100 according to an embodiment for populating a CAD's database with design parameters is shown. As shown, system 100 includes CAD program 101, which may be any CAD program now known or later developed, such as the ADP and ALLEGRO® systems available from Cadence Design Systems, Inc. CAD program 101 provides user interface 102 for receiving various parameters for a desired design from a user and for outputting a representation of the resulting design to the user (e.g., as a schematic diagram and/or a netlist), a specific example of which is shown and described further below. CAD program 101 is communicatively coupled to a database 103 in which it stores design parameters, such as parameters associated with various layers of an electronic design (e.g., material type, thickness, etc.).

System 100 further comprises parameter entry program 104 that is operable to read design parameters from a data file 105 and populate the CAD's database 103 with those design parameters. For instance, information identifying the corresponding type and thickness for each of a plurality of layers for an electronic design may be included in data file 105, and parameter entry program 104 is operable to populate database 103 with that information to enable CAD program 101 to generate a computer-representation (or "model") of the defined electronic design having those parameters. Accordingly, design parameters may be supplied to CAD program 101 via data file 105, rather than requiring that a user manually enter such design parameters via the CAD program's interface 102.

In certain embodiments, parameter entry program 104 is also operable to generate data file 105. For instance, in certain embodiments, parameter entry program 104 is operable to access database 103, retrieve design parameters therefrom, and populate data file 105 with the retrieved design parameters. Thus, a user may interact with the CAD's interface 102 to initially input design parameters for defining an electronic design, and those design parameters may be stored to a data file 105. Thereafter, the user may edit data file 105 and/or reuse data file 105 for populating database 103 for efficiently defining an electronic design to be modeled by CAD program 101.

For instance, the example user interface 102 shown in FIG. 1 provides various input boxes for receiving user input specifying parameters associated with layers of an electronic design. For each of a plurality of layers, the interface 102 includes a text box for specifying the material type of the layer, the layer type, a subclass name, and a photo film type. A user may edit these fields for each layer. For instance, a text box 10 is provided for a layer for defining the material of the layer. The user may click on the input box to receive a drop-down menu from which the user may select the type of material for the layer, which is specified as COPPER in this example. A text box 11 is also provided for the layer for defining the layer type. As illustrated in FIG. 1, the user may click on the input box 11 to receive a drop-down menu from which the user may select the type of material for the layer, such as Conductor, Crossover, Dielectric, Plane, Bonding Wire, Optical Wave Guide, and Thermal Glue Coating. Another text box 12 is provided for the layer for defining the photo film type of the layer. The user may click on the input box 12 to receive a drop-down menu from which the user may select the type of photo film for the layer, which is specified as POSITIVE in this example. Thus, a user may interact with the text boxes and associated drop down menus included in the CAD's interface 102 for inputting various parameters of layers of a desired electrical design.

In certain embodiments, parameter entry program 104 is operable to receive a CAD file (or a "CAD-dependent" file) for a design, and use such CAD file for generating data file 105. For instance, once a first electronic design having a first set of parameters is created via CAD program 101, such design (or model) may be stored as a CAD file, which may be later re-opened by CAD program 101. In certain embodiments, parameter entry program 104 is operable to receive such a CAD file and generate data file 105 therefrom, which as described further below may be in CAD-independent format. Thereafter, the user may edit data file 105 and/or reuse data file 105 for populating database 103 for efficiently defining an electronic design to be modeled by CAD program 101.

For instance, suppose a user desires to evaluate various different designs in which only the material type and/or thickness of various layers are changed for each design. The user may create the initial design via the CAD's interface 102. Thereafter, the user may efficiently model each of the various other designs by editing the material type and thickness parameters in the data file 105, and triggering parameter entry program 104 to populate the CAD's database 103 with those updated parameters for modeling each design. This provides a more efficient technique for populating the CAD's database 103 with design parameters than interacting with the drop-down menus of the CAD's interface 102 for specifying the type and thickness of each layer in each design desired to be modeled. According to certain embodiments, data file 105 is a simple text file that specifies the design parameters, such as the corresponding type and thickness for each layer of a design. In such embodiments, editing of the parameters may be performed efficiently via a text editor (using such techniques as find-and-replace operations, etc.). For instance, if a user desired to change all layers that were initially defined to have a thickness of 1234 micrometers (μm) to a thickness of 1000 μm, the user may perform a find-and-replace operation in the text file to efficiently update the parameters of the design, and the updated parameters may then be populated into the CAD's database 103 for use by the CAD program 101 in generating a representation (or model) of the updated design.

In certain embodiments, data file 105 is in a CAD-independent format. For instance, in certain embodiments, data file 105 is a simple text file. Parameter entry program 104 is operable to generate a CAD-specific representation of the parameters defined in the CAD-independent file 105. For instance, parameter entry program 104 is operable to populate database 103 with the parameter information from data file 105 (i.e., populate the appropriate fields of database 103 with corresponding parameter information from data file 105). Also, because data file 105 may provide design parameters in a CAD-independent format, it may be used for inputting information for various different application programs, such as different CAD programs, simulation programs, debug programs, etc. For example, parameter entry program 104 may be operable to receive data file 105 and populate any one of a plurality of different application programs (such as different CAD programs, simulation programs, etc.) with the design parameter information contained in data file 105.

While parameter entry program 104 and CAD program 101 are shown as separate programs in FIG. 1 (as well as in FIGS. 2 and 6 described below), in certain embodiments the functionality of parameter entry program 104 may be included in CAD program 101. For instance, CAD program 101 may be operable to receive data file 105 for populating database 103, and/or CAD program 101 may be operable to generate data file 105 in the manner described further herein.

Figure 2:
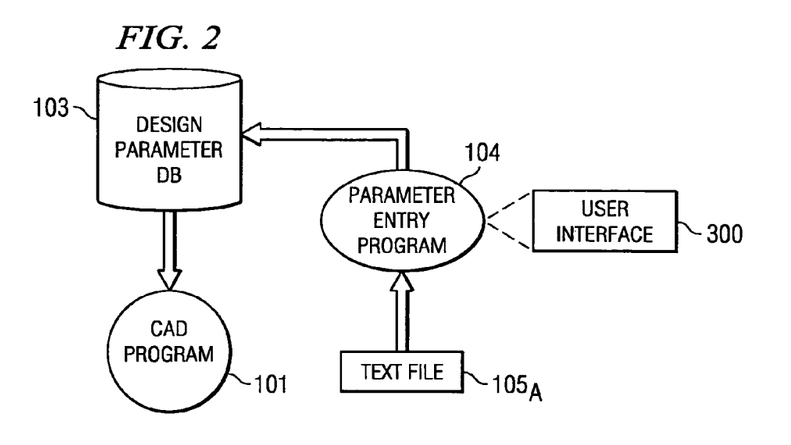
FIG. 2 shows an example flow of parameter data through the system of FIG. 1 for populating a CAD's database with such parameter data.

FIG. 2 shows an example flow of design parameter data through the system of FIG. 1 for populating the CAD's database 103 with such design parameter data in accordance with one embodiment. In this example, design parameter information resides in a text file $105_A$, and parameter entry program 104 retrieves such design parameter information and populates the CAD's database 103 with that design parameter information. CAD program 101 uses the design parameter information of database 103 to model (or generate a representation of) the corresponding electronic design.

An example text file 105A that includes parameter information for a plurality of layers of an electronic design is provided below:

FR-4 Dielectric 1234 μm
COPPER CONDUCTOR LAYER3 POSITIVE 1 μm
FR-4 Dielectric 1234 μm
COPPER CONDUCTOR LAYER2 POSITIVE 34 μm
FR-4 Dielectric 1234 μm
COPPER CONDUCTOR LAYER1 POSITIVE 10 μm
FR-4 Dielectric 1234 μm
COPPER CONDUCTOR LAYER0 POSITIVE 99 μm
FR-4 Dielectric 1234 μm Example Data File In the example text file 105A above, parameter information is provided for nine (9) layers of an electronic design (i.e., four conductor layers identified as layers 0–3, and five dielectric layers). The parameter information identifies a stack that has a first layer (i.e., corresponding to the last line of the example data file) that is a dielectric type formed by material "FR-4" and has a thickness of 1234 μm. The next layer up in the stack ("LAYER0") is identified as a conductor type formed by copper material and has a thickness of 99 μm. As shown in the above example data file, this layer ("LAYER0") also has "POSITIVE" included in its identification, which identifies how the artwork representing this layer is generated in manufacturing (or the photo film type, as shown in the example user interface 102 of FIG. 1). For instance, each layer of the electronic design may be thought of as a stencil, wherein "positive" or "negative" specifies whether a trace in that layer is the hole in the stencil or the solid part of the stencil. This information is typically used only by the manufacturer of the electrical design.

The next layer up in the stack is another dielectric type formed by material "FR-4" and has a thickness of 1234 µm. The next layer up in the stack ("LAYER1") is identified as a conductor type formed by copper material and has a thickness of 10 µm. This LAYER1 is also identified as having a POSITIVE type artwork representation. The next layer up in the stack is another dielectric type formed by material "FR-4" and has a thickness of 1234 µm. The next layer up in the stack ("LAYER2") is identified as a conductor type formed by copper material and has a thickness of 34 µm. This LAYER2 is also identified as having a POSITIVE type artwork representation. The next layer up in the stack is another dielectric type formed by material "FR-4" and has a thickness of 1234 µm. The next layer up in the stack ("LAYER3") is identified as a conductor type formed by copper material and has a thickness of 1 µm. This LAYER3 is also identified as having a POSITIVE type artwork representation. Finally, the top layer in the stack is identified as a dielectric type formed by material "FR-4" having a thickness of 1234 µm.

Figure 3:
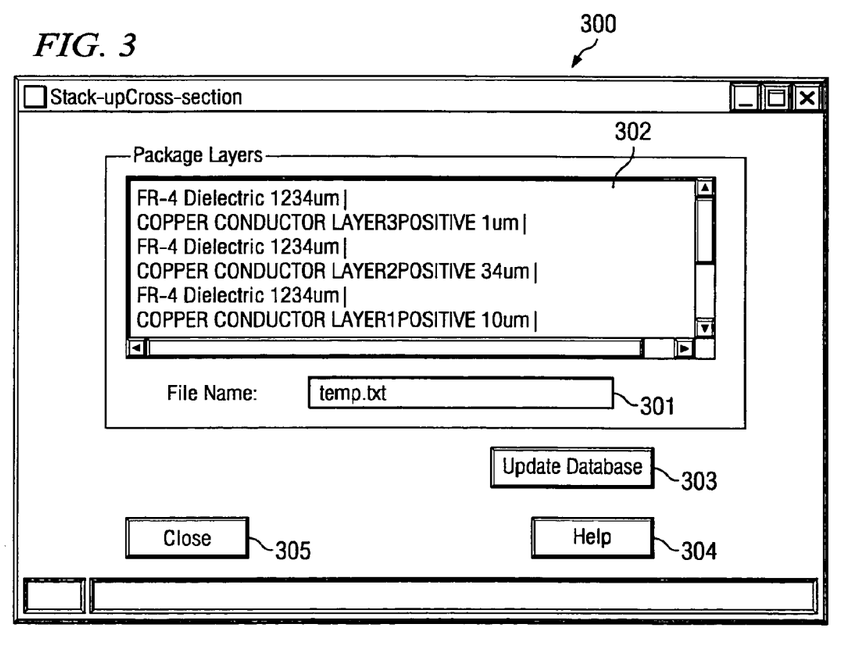
FIG. 3 shows an example user interface of the parameter entry program of FIG. 2.

As shown in FIG. 2, parameter entry program 104 may provide a user interface 300 for interacting with a user. For instance, a user may interact with such user interface 300 to specify the data file (file $105_A$ in this example) to be used for populating the CAD's database 103. An example user interface 300 is shown in FIG. 3. The example user interface 300 of FIG. 3 includes an input text box 301 for receiving identification of a data file to be used for populating the CAD's database 103. In this example, a filename "temp.txt" is supplied as the text file $105_A$ that is to be used for populating the CAD's database 103. In this example, user interface 300 further comprises a preview pane 302 that displays text of the data file specified in text box 301. Thus, the text of file "temp.txt" is displayed in preview pane 302 in the example of FIG. 3. In this manner, a user may review the text in preview pane 302 to verify that "temp.txt" is the correct file desired to be used for populating the CAD's database 103. In certain embodiments, preview pane 302 provides editing capability whereby a user may edit the text of the displayed file by interacting with such preview pane 302. For instance, a user may, in certain embodiments, perform common text-editing functions, such as find-and-replace, deletion of text, insertion of text, etc. via preview pane 302.

User interface 300 further includes an "update database" button 303, which when activated by a user (e.g., by clicking on the button with a pointer device, such as a mouse) triggers parameter entry program 104 to populate the CAD's database with the design parameters of the specified data file ("temp.txt" in this example). User interface 300 further provides a "help" button 304, which when activated by a user provides helpful information on various topics regarding usage of parameter entry program 104. User interface 300 also provides a "close" button 305, which when activated by a user closes the user interface window.

Figure 4:
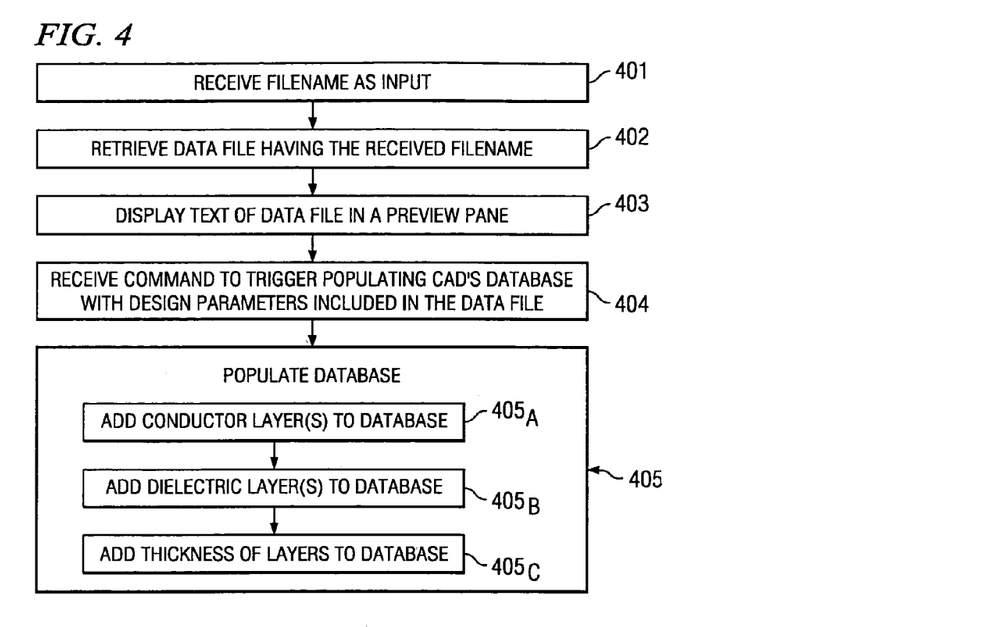
FIG. 4 shows an operational flow diagram of the parameter entry program of FIG. 2 according to one embodiment.

FIG. 4 shows an operational flow diagram of parameter entry program 104 of FIG. 2 according to one embodiment. In operational block 401, parameter entry program 104 receives as input the filename of a data file 105 to be used for populating database 103 (such as filename "temp.txt" in FIG. 3). In block 402, parameter entry program 104 retrieves the data file having the received filename. In block 403, parameter entry program 104 displays text of the retrieved data file in a preview pane 302, such as shown in the example of FIG. 3 above. In block 404, parameter entry program 104 receives a command to trigger populating the CAD's database 103 with design parameters included in the data file. For instance, in the example of FIG. 3, a user may activate the "update database" button 303 to trigger population of the CAD's database 103 with the design parameters contained in the data file. Responsive to such received command, parameter entry program 104 populates the CAD's database 103 with the design parameters of the data file, in block 405.

Figure 6:
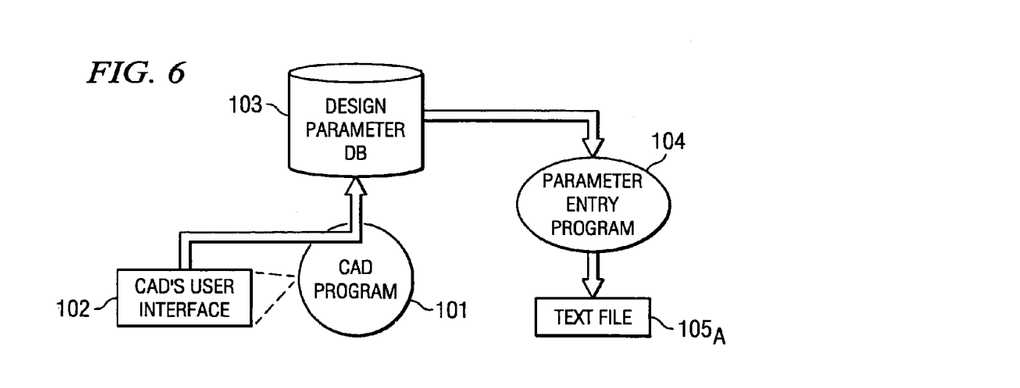
FIG. 6 shows an example flow of parameter data through the system of FIG. 1 for generating a data file with such parameter data in accordance with one embodiment.

As shown in FIG. 4, populating the CAD's database 103 may comprise populating various fields of the database with corresponding information contained in the data file 105. For instance, in this example, parameter entry program 104 adds conductor layer(s) from the data file 105 to the appropriate fields of database 103 in block $405_A$, adds dielectric layer(s) from the data file 105 to the appropriate fields of database 103 in block $405_B$, and adds information identifying the corresponding thickness of each of the layers from the data file 105 to the appropriate fields of database 103 in block $405_C$. In accordance with at least one embodiment, parameter entry program 104 uses scripts to update/alter the CAD's database 103 (i.e., to supply design information to such database 103), wherein the scripts interact with the CAD program 101 duplicating the commands and entries a user would otherwise perform manually via interface 102 for supplying such design information to the CAD's database 103. Thus, while FIGS. 1, 2, and 6 show parameter entry program 104 as interacting with database 103, in certain embodiments such interaction with database 103 is via CAD program 101. In other words, parameter entry program 104 may interact with CAD program 101 to supply and/or retrieve design parameter information to/from database 103. Accordingly, in certain embodiments, it appears to CAD program 101 that a user is interacting with interface 102 for supplying/retrieving design parameter information when in actuality parameter entry program 104 is interacting with CAD program 101 for supplying/retrieving such design parameter information.

Figure 5:
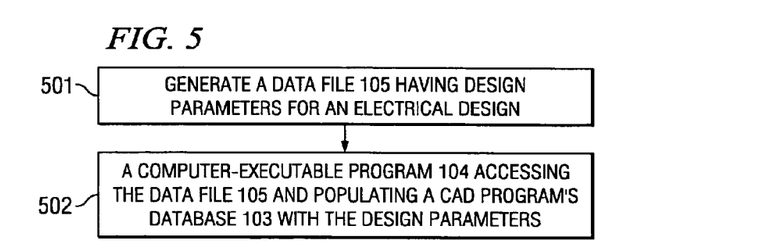
FIG. 5 shows an operational flow diagram for populating a CAD's database with design parameters in accordance with at least one embodiment.

FIG. 5 shows an operational flow diagram for populating a CAD's database with design parameters in accordance with at least one embodiment. In operational block 501, a data file 105 (e.g., a text file $105_A$) is generated having design parameters for an electrical design, such as parameters for layers of the electrical design (e.g., type, thickness, etc.). As described further below, in certain embodiments, the data file 105 may be generated using design parameters from the CAD's database 103. In block 502, a computer-executable program 104 (referred to herein as a "parameter entry program") accesses the data file 105 and populates the CAD program's database 103 with the design parameters contained in such data file 105.

Turning to FIG. 6, an example flow of parameter data through the system of FIG. 1 for generating a data file 105 containing such parameter data in accordance with one embodiment is shown. In this example, a user interacts with user interface 102 (such as via the various drop-down menus shown in the example interface 102 of FIG. 1) to supply design parameter information to CAD program 101, and CAD program 101 populates database 103 with such database for generating a model of the corresponding electronic design. Parameter entry program 104 retrieves such design parameter information from the CAD's database 103 and generates a data file 105 (e.g., a text file 105$_A$ in this example) that contains the design parameters.

Figure 7:
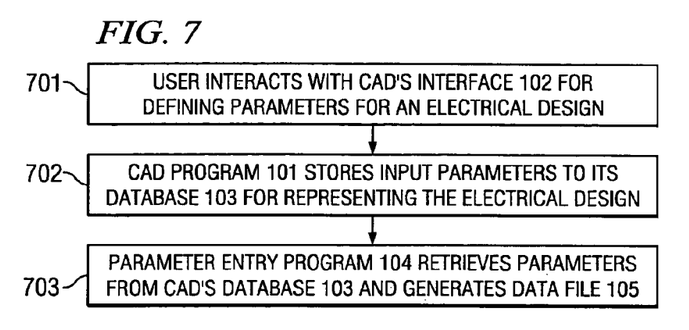
FIG. 7 shows an operational flow diagram for generating the data file of FIG. 6 according to one embodiment.

FIG. 7 shows an operational flow diagram for generating the data file of FIG. 6 according to one embodiment. In operational block 701, a user interacts with the CAD's interface 102 for defining parameters for an electrical design. As described above, this is typically an inefficient process of interacting with drop-down menus for specifying parameters, such as material type and thickness, for each layer of an electrical design. In block 702, CAD program 101 stores input parameters to its database 103 for representing the electrical design. In block 703, parameter entry program 104 retrieves the parameter information from the CAD's database 103 and generates data file 105. For instance, responsive to a user's command to the parameter entry program 104, parameter entry program 104 may retrieve the design parameters for various layers of an electrical design and generate data file 105 (e.g., text file 105$_A$) containing such design parameters. Accordingly, a user may thereafter edit and/or use data file 105 for populating the CAD's database 103 with desired design parameters in a more efficient manner than interacting with the CAD's interface (e.g., drop-down menus) 102.

When implemented via computer-executable instructions, various elements of embodiments for populating a CAD's database with design parameters are in essence the software code defining the operations of such various elements. The executable instructions or software code may be obtained from a readable medium (e.g., a hard drive media, optical media, EPROM, EEPROM, tape media, cartridge media, flash memory, ROM, memory stick, and/or the like) or communicated via a data signal from a communication medium (e.g., the Internet). In fact, readable media can include any medium that can store or transfer information.

Figure 8:
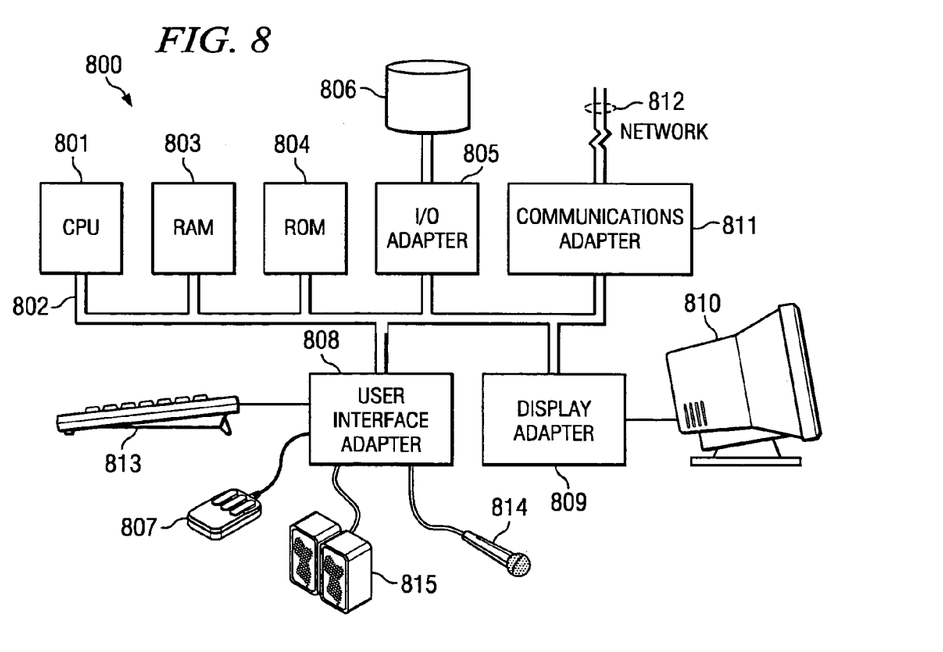
FIG. 8 shows an example computer system adapted according to one embodiment for populating a CAD's database with design parameters.

FIG. 8 illustrates an example computer system 800 adapted according to an embodiment for populating a CAD's database with design parameters. For instance, computer system 800 comprises an example system on which CAD program 101 and/or parameter entry program 104 may be implemented. Central processing unit (CPU) 801 is coupled to system bus 802. CPU 801 may be any general purpose CPU. Embodiments described above are not restricted by the architecture of CPU 801 as long as CPU 801 supports the inventive operations as described herein. CPU 801 may execute the various logical instructions according to embodiments described above. For example, CPU 801 may execute machine-level instructions according to the exemplary operational flows described above in conjunction with FIGS. 4, 5, and 7.

Computer system 800 also includes random access memory (RAM) 803, which may be SRAM, DRAM, SDRAM, or the like. Computer system 800 further includes read-only memory (ROM) 804 which may be PROM, EPROM, EEPROM, or the like. RAM 803 and ROM 804 hold user and system data and programs, as is well known in the art.

Computer system 800 also includes input/output (I/O) adapter 805, communications adapter 811, user interface adapter 808, and display adapter 809. I/O adapter 805, user interface adapter 808, and/or communications adapter 811 may, in certain embodiments, enable a user to interact with computer system 800 in order to input information, such as via user interface 102 of CAD program 101 and/or via interface 300 of parameter entry program 104. User interface adapter 808 couples user input devices, such as keyboard 813, pointing device 807, and microphone 814 and/or output devices, such as speaker(s) 815 to computer system 800. Display adapter 809 is driven by CPU 801 to control the display on display device 810 to, for example, display the user interface 102 of CAD program 101 and/or user interface 300 of parameter entry program 104.

I/O adapter 805 connects to storage device(s) 806, such as one or more of hard drive, compact disc (CD) drive, floppy disk drive, tape drive, etc. to computer system 800. The storage devices may be utilized when RAM 803 is insufficient for the memory requirements associated with storing data for CAD program 101 and/or parameter entry program 104, such as database 103 and/or data file 105. Communications adapter 811 is adapted to couple computer system 800 to a communication network 812, such as the Internet or other wide area network (WAN), a local area network (LAN), a telecommunication network, a wireless network, or any combination thereof, as examples. Thus, in certain embodiments, a user may interact with CAD program 101 and/or parameter entry program 104 from a remote computer via such communication network 812. Further, in certain embodiments, data file 105 and/or database 103 may be stored at a location remote to a computer on which parameter entry program 104 is executing, and parameter entry program 104 may access data file 105 and/or database 103 via communication network 812.

Embodiments described above are not limited to the architecture of example system 800. For example, any suitable processor-based device may be utilized, including without limitation personal computers, laptop computers, computer workstations, and multi-processor servers. Moreover, embodiments of parameter entry program 104 may be implemented on application specific integrated circuits (ASICs) or very large scale integrated (VLSI) circuits. In fact, persons of ordinary skill in the art may utilize any number of suitable structures capable of executing logical operations according to the embodiments described above.

What is claimed is:

1. A method comprising:
   generating a data file having design parameters for an electrical design, wherein the data file includes the design parameters in a CAD-independent format;
   modifying said design parameters in said data file; and
   with a computer-executable program, accessing the modified data file and populating a computer-aided design (CAD) program's database with the modified design parameters.

2. The method of claim 1 wherein the design parameters include parameters for a plurality of layers of the electrical design.

3. The method of claim 1 wherein said generating comprises:
   receiving user input specifying the design parameters.

4. The method of claim 3 wherein said receiving user input comprises:
   receiving said user input via an interface of the CAD program.

5. The method of claim 4 wherein said generating further comprises:
   retrieving the design parameters input via the interface of the CAD program; and
   populating the data file with the design parameters.

6. The method of claim 1 wherein the electrical design comprises a design selected from the group consisting of: an integrated circuit design, a printed circuit board design, a microelectromechanical system (MEMS) design, and a nanoelectromechanical system (NEMS) design.

7. The method of claim 1 wherein said generating comprises:
   retrieving the design parameters from the CAD program's database; and
   populating the data file with the design parameters.

8. A method comprising:
   generating a data file having design parameters for an electrical design, wherein the data file is a text file; and
   with a computer-executable program, accessing the data file and populating a computer-aided design (CAD) program's database with the design parameters.

9. A system comprising:
   a database;
   a parameter entry program stored to computer-readable media and operable to access a data file and populate the database with design parameters included in the data file for an electrical design, wherein the data file is in a CAD-independent format and is editable by an interface; and
   a computer-aided design (CAD) program stored to computer-readable media, wherein the CAD program is operable to communicatively access the database and retrieve the design parameters stored therein.

10. The system of claim 9 wherein the design parameters comprise parameters for a stack of layers of the electrical design.

11. The system of claim 10 wherein the design parameters include at least one selected from the group consisting of:
   layer type and layer thickness.

12. The system of claim 11 wherein said layer type is any selected from the group consisting of: metal, dielectric, crossover, plane, bonding wire, optical wave guide, and thermal glue coating.

13. The system of claim 9 wherein said electrical design comprises a design selected from the group consisting of: an integrated circuit design, a printed circuit board design, a microelectromechanical system (MEMS) design, and a nanoelectromechanical system (NEMS) design.

14. The system of claim 9 wherein the parameter entry program is part of the CAD program.

15. The system of claim 9 wherein the parameter entry program is a stand-alone program separate from the CAD program.

16. A system comprising:
   a database;
   a parameter entry program stored to computer-readable media and operable to access a data file and populate the database with design parameters included in the data file for an electrical design, wherein the data file is a text file; and
   a computer-aided design (CAD) program stored to computer-readable media, wherein the CAD program is operable to communicatively access the database and retrieve the design parameters stored therein.

17. A system comprising:
   computer-aided means for designing an electrical design that comprises a plurality of layers;
   means for storing parameters for the plurality of layers, wherein the storing means is communicatively accessible by the computer-aided design means for representing said electrical design; and
   means for accessing a data file and populating the storing means with said parameters, wherein said data file is a text file.

18. The system of claim 17 further comprising:
   means for generating the data file.

19. A method comprising:
   interacting with an interface of a computer-aided design (CAD) program for defining parameters for an electrical design;
   storing, by said CAD program, the parameters to a database for use in representing the electrical design;
   retrieving, by a parameter entry program, the parameters from the database and generating a data file having at least a portion of the parameters for said electrical design, wherein the data file includes said at least a portion of the parameters in a CAD-independent format;
   editing the parameters in the data file; and
   with a computer-executable program, accessing the data file and populating the database with the edited parameters of the data file.

20. The method of claim 19 wherein said at least a portion of the parameters includes parameters for a plurality of layers of the electrical design.

21. A method comprising:
   interacting with an interface of a computer-aided design (CAD) program for defining parameters for an electrical design;
   storing, by said CAD program, the parameters to a database for use in representing the electrical design; and
   retrieving, by a parameter entry program, the parameters from the database and generating a data file having at least a portion of the parameters for said electrical design, wherein the data file is a text file.

22. A computer comprising:
   a data storage mechanism having software code for a parameter entry program stored thereto;
   at least one processor for executing said software code to access a data file that is in CAD-independent format and populate a database with design parameters included in the data file for an electrical design, wherein said database is communicatively accessible by a computer-aided design (CAD) program for retrieving the design parameters stored in the database; and
   a data storage mechanism having software code for a file editing program stored thereto, wherein the file editing program is executable by the at least one processor to provide an interface for enabling a user to edit the data file.

23. The computer of claim 22 comprising:
   a data storage mechanism having said data file stored thereto.

24. The computer of claim 22 comprising:
   a data storage mechanism having said database stored thereto.

25. The computer of claim 22 comprising:
   a data storage mechanism having software code for said CAD program stored thereto, wherein said at least one processor is operable to execute said software code of said CAD program.

26. The computer of claim 22 wherein the parameter entry program is part of the CAD program.

27. The computer of claim 22 wherein the parameter entry program is a stand-alone program separate from the CAD program.

28. The computer of claim 22 wherein the file editing program comprises any selected from the group consisting of: text editor, word processor, and spreadsheet.

* * * * *